(12) United States Patent
Shi

(10) Patent No.: US 9,078,354 B2
(45) Date of Patent: Jul. 7, 2015

(54) TECHNIQUES FOR ATTENUATING RESONANCE INDUCED IMPEDANCE IN INTEGRATED CIRCUITS

(75) Inventor: Hong Shi, Santa Rosa, CA (US)

(73) Assignee: Altera Corporation, San Jose, CA (US)

( * ) Notice: Subject to any disclaimer, the term of this patent is extended or adjusted under 35 U.S.C. 154(b) by 604 days.

(21) Appl. No.: 13/428,403

(22) Filed: Mar. 23, 2012

(65) Prior Publication Data

US 2012/0176185 A1     Jul. 12, 2012

Related U.S. Application Data

(62) Division of application No. 11/972,550, filed on Jan. 10, 2008, now Pat. No. 8,164,916.

(51) Int. Cl.
*H05K 1/02* (2006.01)
*H01L 23/498* (2006.01)
*H01L 23/50* (2006.01)
*H02J 3/24* (2006.01)
*H05K 1/11* (2006.01)

(52) U.S. Cl.
CPC ........ *H05K 1/0231* (2013.01); *H01L 23/49822* (2013.01); *H01L 23/50* (2013.01); *H05K 1/113* (2013.01); *H05K 2201/09254* (2013.01); *H05K 2201/10674* (2013.01); *H01L 2224/16225* (2013.01); *H01L 2224/16227* (2013.01); *H01L 2224/32225* (2013.01); *H01L 2224/73204* (2013.01); *H01L 2924/15311* (2013.01); *H01L 2924/19105* (2013.01)

(58) Field of Classification Search
USPC .......................................................... 307/102
See application file for complete search history.

(56) References Cited

U.S. PATENT DOCUMENTS

2011/0068878 A1\*    3/2011    Weir et al. ........................ 333/32

\* cited by examiner

*Primary Examiner* — Robert Deberadinis
(74) *Attorney, Agent, or Firm* — Womble, Carlyle, Sandridge & Rice, LLP

(57) ABSTRACT

Provided is an integrated circuit system and method for biasing the same that features bifurcating a power distribution network to provide a bias voltage to the integrated circuit system. One of the branches of the power distribution network attenuates an impedance in the power distribution network that supplies transient currents and the remaining branch supplies a substantially steady-state currents.

18 Claims, 4 Drawing Sheets

TECHNIQUES FOR ATTENUATING RESONANCE INDUCED IMPEDANCE IN INTEGRATED CIRCUITS

PRIORITY

This application is a divisional application of U.S. application Ser. No. 11/972,550, filed Jan. 10, 2008 now U.S. Pat. No. 8,164,916. The disclosure of this related application is incorporated herein by reference for all purposes.

BACKGROUND

The present invention is directed to power distribution networks for integrated circuits. More particularly, the present invention is directed to reducing impedance of power distribution networks.

Power distribution networks are a typical manner in which to provide power to packaged integrated circuits. The power distribution network includes a power supply that generates an appropriate voltages employed to bias the integrated circuit and any other circuits included therewith in a common package.

During normal operations of the integrated circuit, the power usage of the same fluctuates. The power fluctuation varies, inter alia, the impedance of the integrated circuit, which may interfere with operation of the integrated circuit resulting in faulty operation of the same. As a result, there have been several attempts at controlling the impedance of integrated circuit systems.

An existing technique employs multiple low-inductance bypass, or decoupling capacitors. Decoupling capacitors provide a momentary charge to compensate when active devices change current consumption. This momentarily stabilizes the current fluctuation caused by the changing current consumption of the integrated circuit, thereby attenuating impedance fluctuations caused by the varying current consumption. The charge in the bypass capacitors is replenished from the power supply that is connected between each power plane and ground. Usually several hundreds of decoupling capacitors are included in a typical integrated circuit package to attenuate switching noise. However, the presence of decoupling capacitors cause resonance in the power distribution that presents as increased impedance of the same. The resonance is a naturally occurring parasitic phenomena, e.g., inductance, resistance, capacitance, present in the integrated circuit, the package, and power distribution network results in resonance when subject to a time varying current.

Thus, there is a need for to reduce the impedance presented by a power distribution network used to bias an integrated circuit.

SUMMARY

Provided is an integrated circuit system and method for biasing the same that features bifurcating a power distribution network to provide a bias voltage to the integrated circuit system. One of the branches of the power distribution network attenuates an impedance in the power distribution network that supplies transient currents and the remaining branch supplies a substantially steady-state currents. To that end the system includes a substrate on which the integrated circuit is mounted and a power distribution network. The power distribution network is in electrical communication with the integrated circuit and includes first and second branches. The first branch is configured to attenuate an impedance in the power distribution network that supplies transient currents and the second branch supplies a substantially steady-state current to the power distribution network.

In another aspect of the invention, a method for biasing an integrated circuit is provided. The method includes applying a bias voltage to a power distribution network in electrical communication with the integrated circuit and dampening resonance in the power distribution network. The dampening is achieved by routing the bias voltage to the integrated circuit along two different branches, each of which has a resistance associated therewith. The resistance of one of the two different paths being different than the remaining path of the two different paths. One of the paths takes advantage of the relatively high die resistance provided through the on die connection due to the relatively small traces of the die. These and other embodiments of the present invention are described more fully below.

BRIEF DESCRIPTION OF THE DRAWINGS

The present invention can be best understood by reference to the following description taken in conjunction with the accompanying figures, in which like parts may be referred with like numerals.

DETAILED DESCRIPTION

Figure 1:
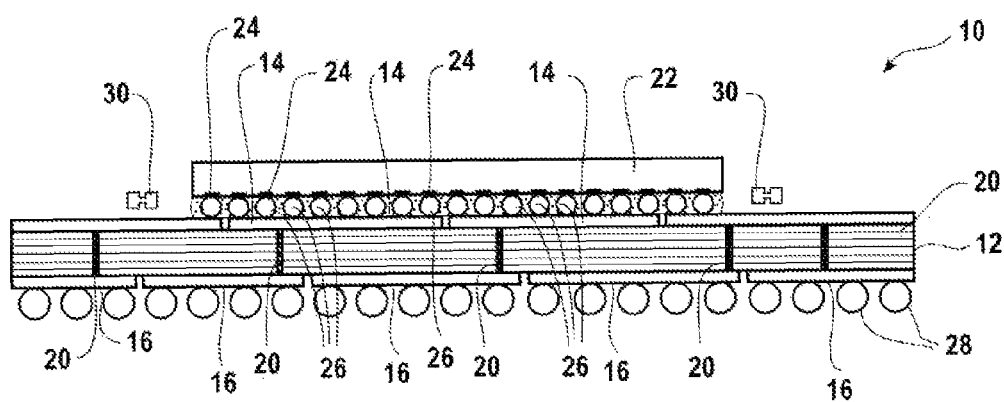
FIG. 1 is a simplified cross-sectional view of an integrated circuit package in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

The embodiments described herein provide a technique for reducing a high impedance peak generated from parallel resonance of an on die decoupling capacitor and package series inductance. The embodiments reduce resonance induced peak impedance in a die-package power distribution network (PDN) by using on-die resistance and two-branch routing on packages. Through the embodiments, a high resistive path of the on-die power network is utilized to suppress peak impedance induced by die-package parallel inductance-capacitance (LC) resonance. The use of a two-branch approach in the PDN routing, i.e., a low inductive branch and a high inductive branch, facilitates effective on-package-decoupling (OPD) implementation and reduces overall die-package-board impedance. In addition, the two-branch package PDN/OPD structure optimizes both transient current and steady state current supply for a low noise power. As illustrated in more detail below, use of the relatively higher resistive die power grid with virtually no inductance, accommodates the needed resistance for a low Q factor. The low inductive package path is connected to selected high resistive power bumps at a bump end, and the OPD at the package end of a top layer in one embodiment. Low inductance and high resistance co-existing in the die-package integrated PDN effectively suppress the resonance peak and Q factors, enabling the OPD implementation on the low inductive branch without incurring any extra complexity and cost.

At the same time, the high inductive and low resistive package branch connects to the rest of the power bumps at the die side and package balls on the printed circuit board (PCB) side. This branch employs low counts of plated through hole (PTH) vias and power balls because its function is to meet a steady state current and power supply, rather than OPD connection. The result of low PTH via counts and ball counts translates directly into low complexity and low cost. Because the low inductive, high resistive and OPD branch is nearby the die, the charge stored in the OPD will be replenishing I/O buffers with the least impedance and resonance in one embodiment. Thus, the low inductive path will provide the transient current for the smallest voltage bounce and after the transient signaling moment has passed, i.e., after a transition from a logical high or low state. The high inductive branch will provide the direct current (DC) during logic high, low and steady mode. It should be appreciated that relatively high inductance is transparent to a low varying DC current, therefore the voltage drop as result of this inductance in this branch is minimal.

Referring to FIG. 1, an integrated circuit package 10 is shown as including substrate 12 having a plurality of integrated circuit contact pads 14 disposed upon one side thereof. A plurality of output contact pads 16 is disposed on a side of substrate 12 that is opposite to the side upon which integrated circuit contact pads 14 are disposed. Conductive vias 20 place different subsets of integrated circuit contact pads 14 in electrical communication with different subsets of output contact pads 16. Integrated circuit 22 includes a plurality of bonding pads 24. Integrated circuit 22 is mechanically and electrically coupled to substrate 12 by solder bumps 26 disposed between bonding pads 24 and contact pads 14, using techniques well known in the art, discussed further below. Signals from integrated circuit 22 are transmitted outside of integrated circuit package 10 by solder bumps 28 that are attached to and in electrical communication with contact pads 16. Solder bumps 28 are also used to couple bias voltages to integrated circuit 22.

Still referring to FIG. 1, integrated circuit system 10 includes additional discrete components, such a capacitor 30, also referred to as a decoupling capacitor, to facilitate operation of integrated circuit 22. Capacitors 30 are employed to reduce the resonance generated by integrated circuit 22 by facilitating configuration of a dual branch power distribution network (PDN) employed to bias integrated circuit 22. As illustrated further below, two branches are defined. One branch includes capacitor 30 located proximate to the integrated circuit 22 and provides current or power during transient states, i.e., switching states from a logic high or low value, while the other branch provides current or power during steady states. In one embodiment, capacitor 30 is defined on a top layer or upper layer of substrate 12 so as to be proximate to integrated circuit 22.

Figure 2:
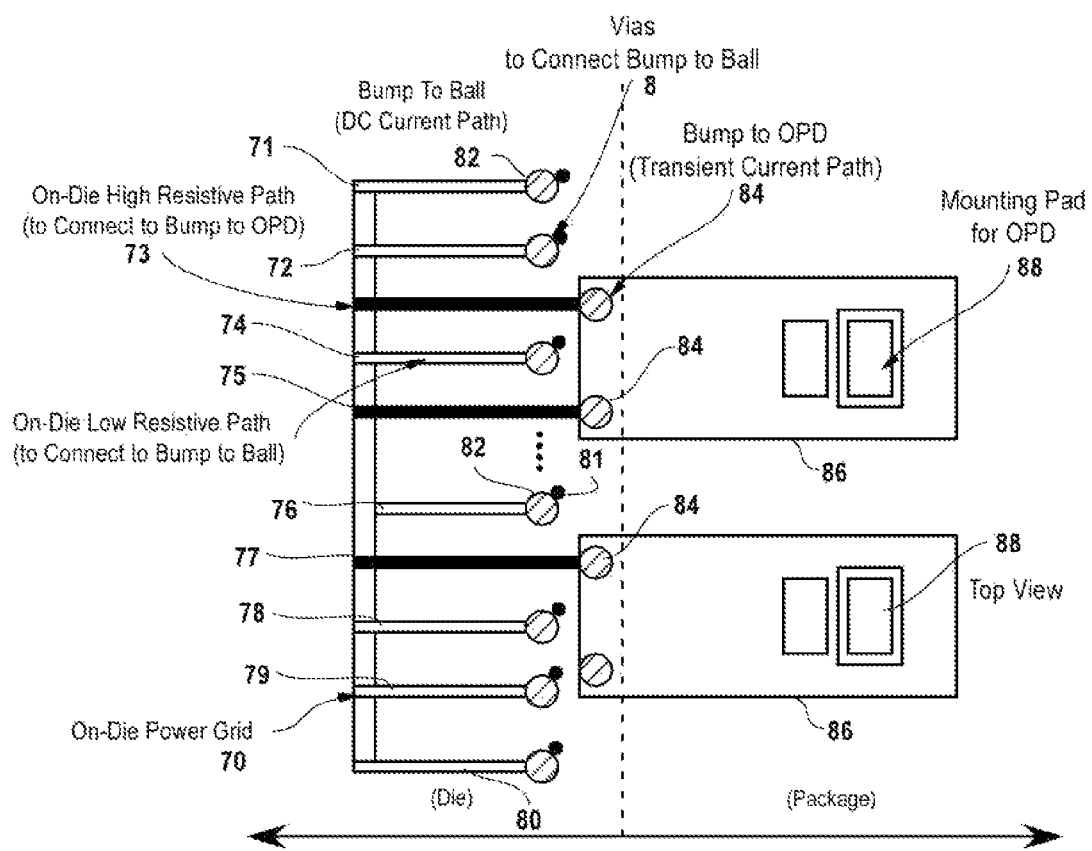
FIG. 2 is a simplified schematic diagram of a top view of the dual branch power distribution network in accordance with the present invention.
Figure 3:
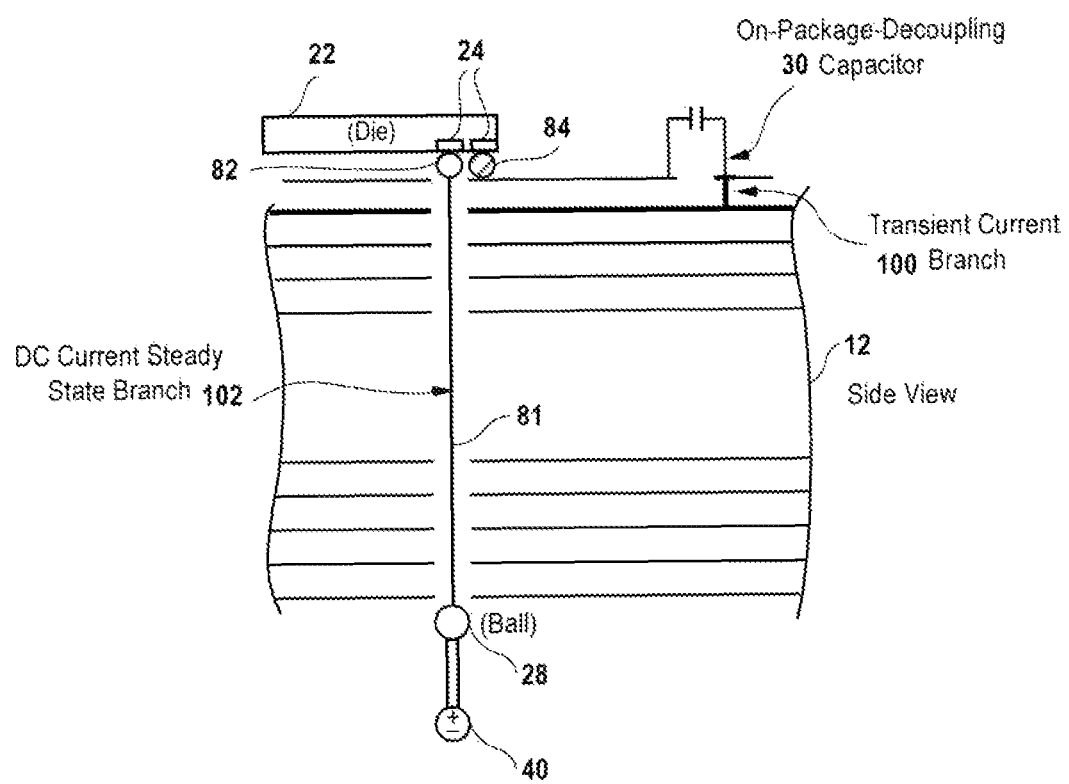
FIG. 3 is simplified schematic diagram of a cross sectional side view of a portion of the dual branch power distribution network, in accordance with the present invention.

Referring to FIGS. 1, 2 and 3, one manner in which to provide resistive elements is to vary the conductivity in the path between a power grid 70 for integrated circuit 22 and both bias voltage supply 40 and capacitor 30. To that end, fewer conductive traces 71-80 are in electrical communication with capacitor 30 as compared to the conductive traces that are in electrical communication with bias voltage supply 40. As shown in FIG. 2, traces 71, 72, 74, 76, and 78-80 are in electrical communication with bias voltage supply 40 by way of vias 81 extending through substrate 12 to solder bump 28.

In one embodiment, voltage supply 40 of FIG. 3, provides a voltage in the range of 1.5-3.3 volts for the integrated circuit. This range is exemplary and not meant to be limiting as alternative voltage ranges may be supplied dependent of the integrated circuit. Traces 73, 75 and 77 are in electrical communication with capacitor 30. As a result, there are seven solder balls, represented by solder ball 82 in FIG. 2, coupling power grid 70 to bias voltage supply 40 and three solder balls, represented by solder ball 84 in FIG. 3, coupling capacitor 30 to power grid 70. It should be appreciated that solder balls 82 and 84 correspond to solder balls 26 of FIG. 1. In one embodiment, each of signal traces 73, 75, and 77 of FIG. 3 couple to bonding pad 86, to which one side of capacitor 30 is in electrical communication with, through mounting pad 88. Capacitor 30 is coupled to mounting pad 88 through a solder ball, which in turn is in electrical communication with corresponding solder bumps 84 through bonding pad 86 (or another suitable conductive trace) connecting mounting pad 88 with corresponding solder bumps 84 in one embodiment. As illustrated in FIG. 3, bonding pad 24 may be used to provide an electrical pathway between solder bumps 82 and 84 of integrated circuit 22. As detailed in FIG. 3, and as further illustrated in FIG. 4, a transient current branch 100 and a DC steady state branch 102 are provided in this packaging configuration. Branch 100 functions to minimize the time required to provide a range of transient currents to integrated circuit 22, while branch 102 functions to provide a steady-state current to the integrated circuit. In one embodiment, capacitor 30 is sized to provide about 10-100 nano-farads (nF), however this size is exemplary and not meant to be limiting. One skilled in the art will appreciate that a flip chip package with a ball grid array is provided in the exemplary illustrations of FIGS. 1-3. However, this is not meant to be limiting as the techniques described herein may be applied to alternative packaging configurations. In addition, substrate 12 may be a packaging substrate typically used in integrated circuit packaging where the substrate includes a plurality of layers disposed around a core and where the layers may be ground or power planes separated by insulating layers.

Figure 4:
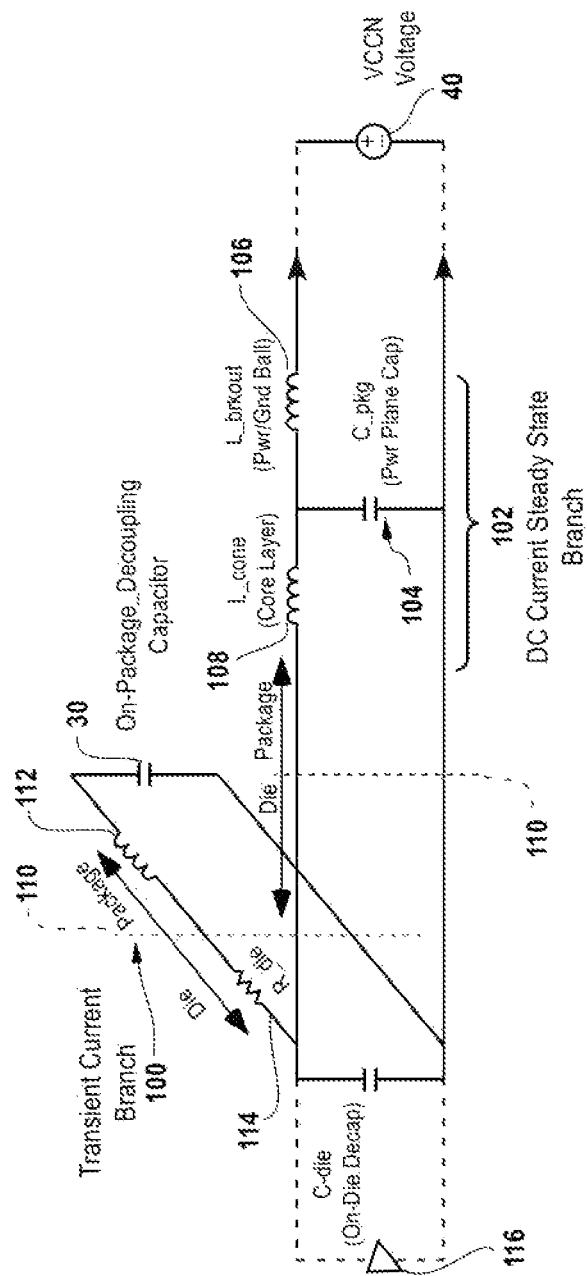
FIG. 4 is a simplified schematic diagram of the electrical circuit representation of the dual branch power distribution network of the integrated circuit system in accordance with the present invention.

FIG. 4 is a simplified schematic diagram illustrating an electrical representation of the power distribution network having on-die resistance with dual branch routing in accordance with one embodiment of the invention. A first branch 100 represents the transient current branch. A second branch 102 represents the DC steady state branch. Branch 102 includes voltage source 40 in parallel with capacitor 104. It should be appreciated that capacitor 104 is a power plane capacitor, also referred to as a decoupling capacitor which may be supplied on the printed circuit board. Within branch 102 an inductance 106 is represented from the power ground-ball connection. In addition, inductance 108 represents the core layer inductance of the package. Dotted line 110 represents a break between the package and the die. Branch 100 includes on-package decoupling capacitor 30. Here again, the package portion and the die portion are separated by line 110. Within transient current branch 100 an inductance 112 is represented for the package portion of the transient current branch. In addition, the die portion has a resistance 114 also represented. The transient current branch 100 and the DC steady state branch 102 provide the current and power to the integrated circuit. It should be noted that the two branches of FIG. 4 split on the die side prior to routing out to the package portion.

Within the integrated circuit of FIG. 4, a buffer 116 may be disposed and in electrical communication with the transient current branch 100 and DC steady state branch 102. On-die capacitor 116 is disposed within the die of the integrated circuit. It should be appreciated that as the relative distance traveled for signals on the DC steady state branch 102 compared to the relative to a distance for signals traveled on transient current branch 100 is much greater, the inductance for the DC steady state branch 102 is much greater than the inductance for transient current branch 100. It should be further appreciated that the resistance for the transient current branch 100 is much greater as a result of the differences in lines or traces between the die and package portions. Accordingly, this larger resistance is used to damp the impedance incurred through the electrical representation described herein. That is, the intrinsic high lossy connection of the die is taken advantage of through the embodiments described herein. Furthermore, since the connection is relatively small as described with regard to FIGS. 2 and 3, the inductance included is relatively small. In essence, more resistance is being added than any accompanying inductance. Since decoupling capacitor 30 is relatively close to the die package the inductance is very small, as compared to decoupling capacitors 104 which may be placed on a printed circuit board. In one embodiment, the first branch resistance is approximately 100 milli-ohms, which may be an order of magnitude greater than the resistance for the DC steady state branch 102. In another embodiment, decoupling capacitor 104 is sized on the order of pico-farads. although this is not meant to be limiting.

Still referring to FIG. 4, inductance 112 represents the parasitic inductance presented by the conductive and dielectric material from which the power distribution network is formed. As such, inductance 112 is a function of a distance between capacitor 30 and connections to the circuitry on the die. It is desired to minimize inductance 112 so as to minimize the time required to supply current to buffer 116 of the integrated circuit. As is well known, however, a changing current across inductance 112 produces resonance at a frequency that may be related as follows:

$$di/dt \propto I \qquad 1.$$

where di is the change in current across inductance 112 and dt is a change in time and I is the intensity of resonance generated by the power distribution network. The impedance Z is directly proportional to the intensity I and may be expressed as follows:

$$I \propto Z \qquad 2.$$

where di is the change in current across inductance 112, dt is a change in time and Z is impedance. By substitution of equations 1 and 2, impedance Z can be related to a change in current as follows:

$$di/dt \propto Z \qquad 3.$$

Thus, it can be seen that the impedance, Z, increases as the rate of change of current increases. The greater the efficiency in minimizing the time required for current to be supplied to the active circuit, the greater the impedance generated by the power distribution network. To attenuate the impedance generated by the power distribution network, resistive element 114 is provided with an appropriate value that functions to dampen the resonance generated in furtherance of obtaining the impedance desired. In one embodiment, the value associated with resistive element 114 is on the order of 10 to 100s of micro Ohms, however this value is not limiting.

Inductance 108 and 106 of the second branch of the power distribution network also represents the parasitic inductance presented by the conductive and dielectric materials from which the same is formed. As a result, inductance 108 and 106 are much greater than inductance 112, because, inter alia, of the length conductive lines between bias voltage supply 40 and the active circuit. In one embodiment, branch 100 is a short transient current branch, on the order of a few millimeters. Branch 102, the DC current branch, is on the order of 10's of millimeters in length on the package plus an additional length on the order of inches on the printed circuit board before reaching VCCN voltage 40. Accordingly, the capacitance of capacitor 30 is smaller relative to the capacitance of capacitor 104. In addition, as the traces within the die are relatively small from the package traces, the resistance encountered is intrinsically higher relative to the resistance of the DC steady state branch.

In summary, the embodiments describe a method and apparatus for reducing resonance induced peak impedance of a die package power distribution network. In the method and apparatus, a first branch is utilized to supply a constant current, while a second branch is used to supply a transient current. As illustrated above, the second branch is on the die portion of the package and splits from the first branch before route out of the die.

Although exemplary embodiments have been described, various modifications can be made without departing from the spirit and/or scope of the present invention. Therefore, the present invention should not be construed as being limited to the specific forms shown in the drawings and described above.

What is claimed is:

1. A method for biasing a system including an integrated circuit, the method comprising
routing a bias voltage to the integrated circuit along first and second branches of a power distribution network in the integrated circuit, wherein a resistance of a first branch is greater than a resistance of a second branch, wherein an inductance of the first branch is less than an inductance of the second branch, wherein the higher resistance, lower inductance first branch provides transient current arising from logic transitions of the integrated circuit, and wherein the lower resistance, higher inductance second branch provides direct current during high, low and steady modes of logic of the integrated circuit.

2. The method as recited in claim 1 wherein a length of the first branch to the integrated circuit is less than a length of the second branch to the integrated circuit, the first branch defined within a substrate to which the integrated circuit is mounted.

3. The method as recited in claim 2 wherein dampening further includes disposing a capacitive element in the second branch, the capacitive element placed on a board to which the substrate is mounted.

4. The method as recited in claim 1 further comprising:
using a capacitive element disposed in the first branch to provide current to said integrated circuit during transition of a steady state current within the integrated circuit.

5. The method as recited in claim 4 further comprising:
providing the steady state current to the integrated circuit through the second branch.

6. The method as recited in claim 1 wherein the first branch is associated with a first inductance and the second branch is associated with a second inductance having a value that is greater than the first inductance.

7. A method for biasing a system including an integrated circuit, the method comprising:
applying a bias voltage to a power distribution network in electrical communication with the integrated circuit; and dampening resonance in the power distribution network, wherein the dampening includes,
routing the bias voltage to the integrated circuit along first and second branches of the power distribution network in the integrated circuit, wherein a resistance of a first branch is different than a resistance of a second branch, and wherein a steady state current is applied along the first branch and a transient current is applied along the second branch.

8. The method of claim 7, further comprising:
mounting the integrated circuit to a substrate;
positioning a first capacitor on a surface of the substrate, proximate to the integrated circuit; and
connecting the first capacitor to the first branch, wherein the first capacitor provides at least a portion of a transient current to the integrated circuit along the first branch.

9. The method of claim 7 further comprising connecting a first capacitor to the first branch using a first set of ball grids.

10. The method of claim 7, further comprising:
positioning a second capacitor on the substrate; and
connecting the second capacitor to the second branch.

11. The method of claim 10 wherein the second capacitor is connected to the second branch using a second set of ball grids.

12. A method for biasing an integrated circuit, comprising:
mounting the integrated circuit to a substrate, the substrate being in electrical communication with the integrated circuit;
positioning a first capacitor on the substrate;
coupling a first resistive portion of a first branch of a die portion of a power distribution network to the first capacitor;
positioning a second capacitor on the substrate; and
coupling a second branch of the die portion of the power distribution network to the second capacitor, wherein the first branch is higher in resistance and lower in inductance than the second branch, wherein the first capacitor and the first branch provide transient current to the integrated circuit, and wherein the second branch provides a substantially steady-state current to the integrated circuit.

13. The method of claim 12, wherein:
a package portion of the power distribution network includes the first capacitor and the second capacitor;
the first branch includes a first inductance associated with the package portion;
the first branch is configured to attenuate an impedance in the power distribution network that supplies the transient current to the integrated circuit; and
the second branch is configured to supply the substantially steady-state current to the integrated circuit through a via extending from a top surface of the substrate to a bottom surface of the substrate.

14. The method of claim 12, wherein the second branch includes a second resistive portion having a resistance value that is less than a resistance value of the first resistive portion.

15. The method of claim 12, wherein the second branch has a second inductance having a value that is greater than a value of the first inductance.

16. The method of claim 12, wherein a capacitance value of the second capacitor is larger than a capacitance value of the first capacitor.

17. The method of claim 12, further comprising:
mounting the substrate on a printed circuit board;
mounting a plurality of decoupling capacitors to the printed circuit board; and
coupling each of the plurality of decoupling capacitors to the second branch.

18. The method of claim 12, wherein:
the first capacitor is coupled to the first resistive portion of the first branch using a plurality of solder balls; and
the second capacitor is coupled to the second branch using a further plurality of solder balls.

* * * * *